United States Patent
Song (10) Patent No.: US 7,208,938 B2
(45) Date of Patent: Apr. 24, 2007

(54) TEST TRAY FOR HANDLER

(75) Inventor: Yeon-Gyu Song, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/362,291

(22) Filed: Feb. 23, 2006

(65) Prior Publication Data

US 2006/0197519 A1    Sep. 7, 2006

(30) Foreign Application Priority Data

Mar. 5, 2005    (KR) ............... 10-2005-0018427

(51) Int. Cl.
*G01R 31/28* (2006.01)

(52) U.S. Cl. .............. 324/158.1; 324/758; 414/222; 198/345.3

(58) Field of Classification Search ......... 324/158.1, 324/765; 269/43.37; 182/129; 248/210, 248/238; 211/70.6; 414/222; 209/573; 198/345.3
See application file for complete search history.

(56) References Cited

U.S. PATENT DOCUMENTS

| | | | | |
|---|---|---|---|---|
| 5,227,717 A * | 7/1993 | Tsurishima et al. | ......... | 324/754 |
| 5,625,287 A * | 4/1997 | Nakamura et al. | ....... | 324/158.1 |
| 5,675,957 A * | 10/1997 | Kim | .......................... | 53/242 |
| 5,784,770 A * | 7/1998 | Long et al. | ................ | 29/564.4 |
| 5,805,472 A * | 9/1998 | Fukasawa | .................... | 702/118 |
| 5,810,170 A * | 9/1998 | Alvite | ........................ | 206/714 |
| 5,969,537 A * | 10/1999 | Kanno et al. | ............... | 324/760 |
| 5,973,493 A * | 10/1999 | Nakamura et al. | ....... | 324/158.1 |
| 6,237,286 B1 * | 5/2001 | Williames | .................. | 47/66.5 |
| 6,346,682 B2 * | 2/2002 | Kim et al. | .................. | 209/573 |
| 6,665,929 B1 * | 12/2003 | Bright | ......................... | 29/837 |
| 6,688,453 B2 * | 2/2004 | Alviar et al. | ............ | 198/346.1 |
| 6,713,013 B2 * | 3/2004 | Wunderlich | ................ | 264/532 |

(Continued)

FOREIGN PATENT DOCUMENTS

JP       08-012068       1/1996

(Continued)

OTHER PUBLICATIONS

English language abstract of Korean Publication No. 0122277, May 8, 1998.

(Continued)

*Primary Examiner*—Ha Tran Nguyen
*Assistant Examiner*—Arleen M. Vazquez
(74) *Attorney, Agent, or Firm*—Marger Johnson & McCollum, P.C.

(57) ABSTRACT

A test tray includes a rectangular shaped frame and a plurality of transport modules to receive a plurality of semiconductor devices. A precise location-determining unit mounted on both sides of the frame to precisely determines and fixes the test tray location. According to one embodiments, the precise location-determining unit includes a locking hole to receive a positioner, a bushing to prevent locking hole wear, a protection bar to cover the frame and the bushing. The test tray prevents yield reduction and handler malfunction, e.g., sudden stopping of the handler, by precisely fixing tray and semiconductor device position during loading, unloading, and testing. The test tray can be extensively without repair or replacement because locking hole, with protective bushing therein, enjoys little or no wear.

16 Claims, 6 Drawing Sheets

U.S. PATENT DOCUMENTS 6,972,581 B2 * 12/2005 Yamashita et al. .......... 324/760

FOREIGN PATENT DOCUMENTS

| KR | 10-1997-0073854 | 12/1997 |
| KR | 0122277 | 5/1998 |
| KR | 2003-0034454 | 5/2003 |

OTHER PUBLICATIONS

English language abstract of Korean Publication No. 2003-0034454, May 9, 2003.

English language abstract of Japanese Publication No. 08-012068, Jan. 16, 1996.

* cited by examiner

TEST TRAY FOR HANDLER

CROSS-REFERENCE TO RELATED PATENT APPLICATION

This application claims the benefit of Korean Patent Application No. 10-2005-0018427, filed on Mar. 5, 2005, in the Korean Intellectual Property Office, the disclosure of which is incorporated herein in its entirety by reference.

BACKGROUND

1. Field of the Invention

The present invention relates to a test tray used in a handler transporting semiconductor devices such as during semiconductor device testing.

2. Description of the Related Art

In general, semiconductor devices, e.g., semiconductor integrated circuits or ICs including memory semiconductor devices, non-memory semiconductor devices, and module ICs in which such semiconductor devices are mounted on a single substrate in a circuit manner, are shipped after being tested. Accordingly, semiconductor device testing is an important manufacturing process wherein yield, e.g., percentage of manufactured devices passing testing procedures and available for shipping, is determined. A handler is an apparatus used to automatically test the semiconductor devices.

A handler includes a test tray. The test tray is used when loading a semiconductor device, when transferring the semiconductor device as loaded thereon to a test head, when directly testing the loaded semiconductor device in the test head, or when unloading the semiconductor device following testing.

The location of the test tray must be precisely determined when a semiconductor device is tested in the test head or when a semiconductor device is loaded upon or unloaded from the test head. If the location of the test tray is not precisely determined, the yield of tested semiconductor devices may be inaccurately low. For example, a false failure may be indicated due to imprecise positioning of the semiconductor device during testing and an otherwise viable device may be lost. Also, the handler may malfunction or suddenly stop functioning due to imprecise positioning and production rates may fall.

Accordingly, handler operation, especially test tray positioning, can affect product yield and production rates.

SUMMARY

Embodiments of the present invention provide a test tray that can be used continuously with precisely determined location when semiconductor devices are loaded, unloaded, and tested. According to embodiments of the present invention, a test tray includes a position-determining formation engaged by a compatible formation adjacent to and along the movement direction of the tray to fix the tray in position during loading, unloading, and testing procedures.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Embodiments of the present invention will now be described more fully with reference to the accompanying drawings. The invention may, however, be embodied in many different forms and should not be construed as being limited to the particular embodiments set forth herein; rather, these embodiments are provided as through and complete disclosure and will fully convey the present invention to those skilled in the art.

Figure 1:
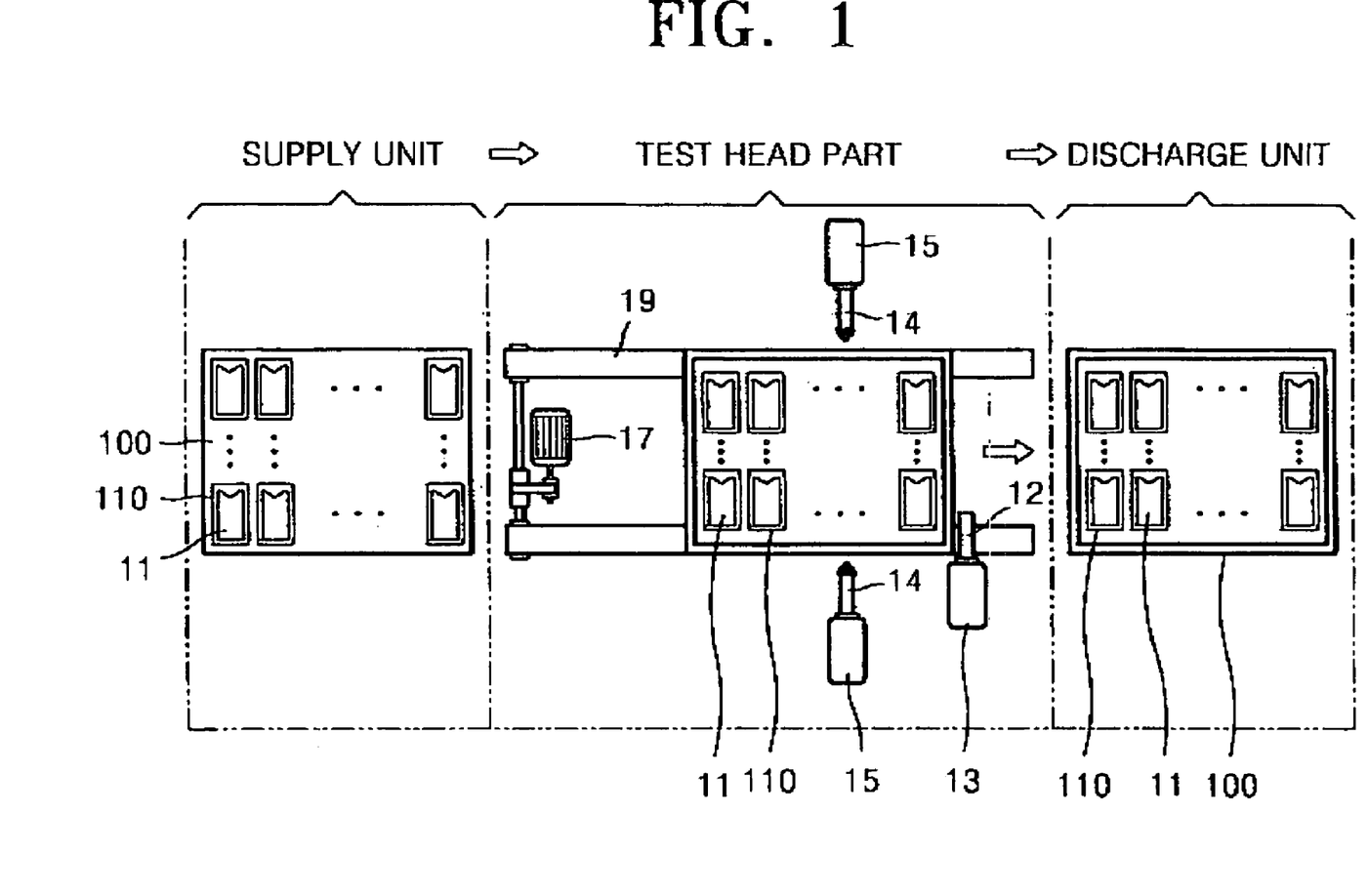
FIG. 1 is a plan view illustrating a handler for testing semiconductor devices, according to an embodiment of the present invention.
Figure 2:
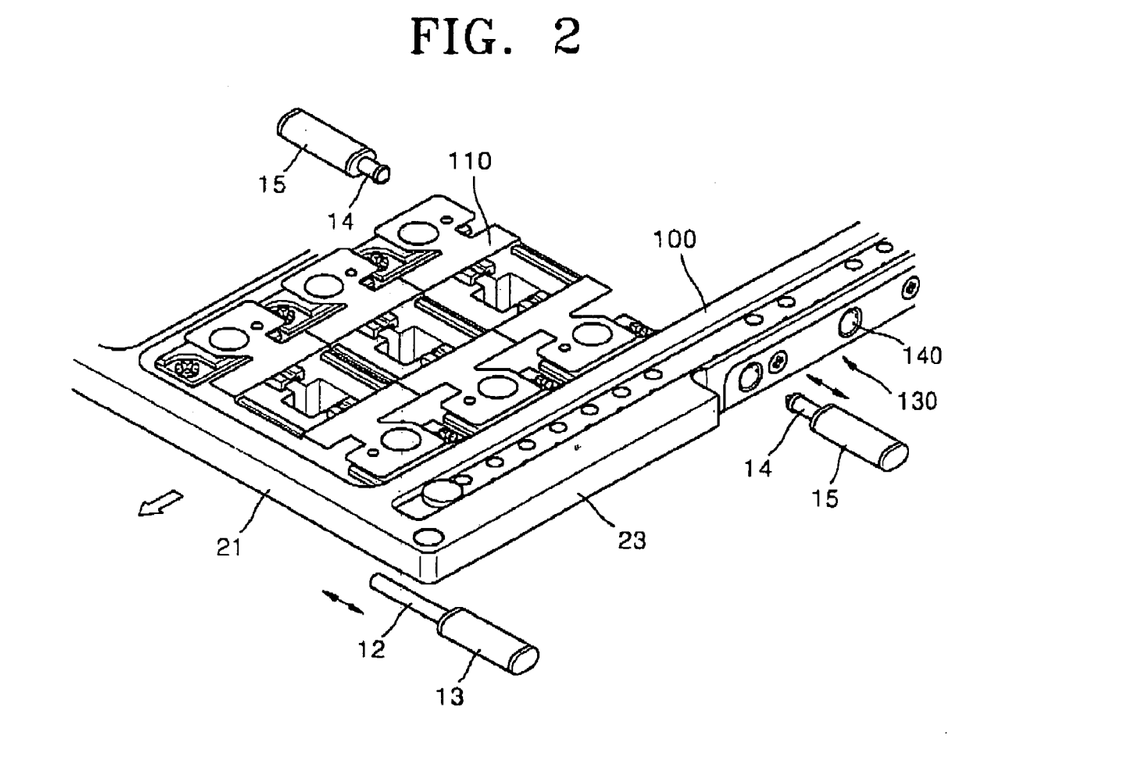
FIG. 2 is a perspective view illustrating a method of determining the location of a test tray included in the handler of FIG. 1.

FIG. 1 is a plan view illustrating a handler for testing semiconductor devices according to an embodiment of the present invention, and FIG. 2 is a perspective view illustrating a method of determining the location of a test tray included in the handler of FIG. 1.

More specifically, referring to FIG. 1, a test tray 100 is used for transferring semiconductor devices 11. The test tray 100 according to an embodiment of the present invention can be used for loading (mounting) a plurality of semiconductor devices 11, for directly testing the semiconductor devices 11, and for unloading the semiconductor devices 11 after testing. In the subsequent descriptions, the use of a precise location-determining unit 130 for precisely determining a location of the test tray 100 under or in relation to the test head part is described, but it will be understood that the precise location-determining unit 130 can be used for a supply unit and a discharge unit, e.g., in transport applications other than positioning relative to a test head part.

The test tray 100 is first disposed in the supply unit. The plural semiconductor devices 11 are loaded on each of a plurality of transport modules 110 in the test tray 100. The test tray 100, on which the semiconductor devices 11 are loaded, is transferred to a test head part, e.g., moving left-to-right in the view of FIG. 1 and right-to-left in the view of FIG. 2. The test tray 100 is thereby transferred along a movement or transfer path by a driving force supplied from a motor 17 on a conveyor belt 19 in a movement direction indicated by an arrow in FIGS. 1 and 2, and is initially stopped by a protrusion portion 12 of an end part of a stopper 13 selectively locatable in front of a leading portion 21 of the tray 100. The protrusion portion 12 of the end part of the stopper 13 moves back and forth, e.g., as a plunger movement, with respect to the stopper 13.

The location of the test tray 100, as initially stopped by the stopper 13, is further precisely determined and fixed by a precise location-determining unit 130 mounted on both sides of the test tray 100 and a positioner 15. A locking hole 140, depicted in FIG. 2, is included in the precise location-determining unit 130 of the test tray 100, and the location of the test tray 100 is precisely determined and fixed by inserting a pin-shaped protrusion portion 14 of an end part of the positioner 15 into the locking hole 140. The protrusion portion 14 of the positioner 15 is formed in a conical shape for easy insertion into the locking hole 140. The protrusion portion 14 of the positioner 15, or the entire positioner 15, can selectively move back and forth.

The test tray 100 can be continuously used, e.g., without frequent maintenance or replacement, since a bushing 145 (FIGS. 4 and 5) located in hole 140 prevents or substantially reduces wear of the locking hole 140. If the bushing 145 is worn or damaged, the bushing 145 can be replaced without need to replace the entire test tray 100. Therefore, the test tray 100 can be used through extended periods without intervening maintenance or replacement procedures possibly affecting production rates.

When a precise location of the test tray 100 is determined, a test for the semiconductor devices 11 loaded on the test tray 100 is performed. The test of the semiconductor devices 11 is performed by electrically contacting sockets or pin cards (not shown) located on a lower part of the test tray 100, e.g., by pressing the test tray 100 downward. A plurality of semiconductor devices 11 are tested simultaneously by mounting a plurality of electrically contacting portions between the sockets and the semiconductor devices 11.

With the protrusion portion 14 of the positioner 15 inserted into the locking hole 140, the test can be stably performed in a fixed state of the test tray 100. The test tray 100, on which the tested semiconductor devices 11 remain loaded, is transferred to a discharge unit. The semiconductor devices 11 are then unloaded according to a classification of viable and failed devices.

Figure 3:
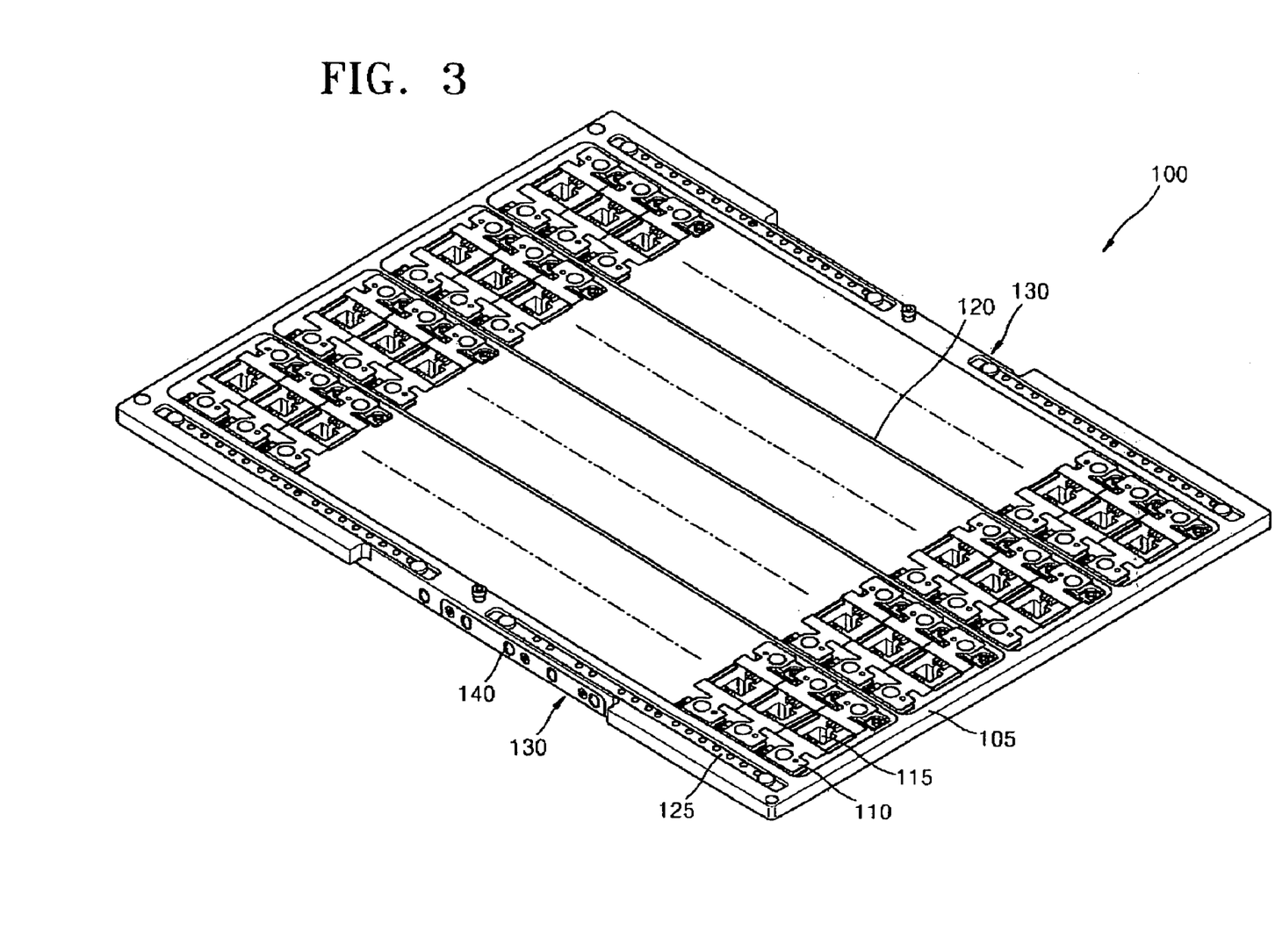
FIG. 3 is a perspective view of a test tray according to an embodiment of the present invention.
Figure 4:
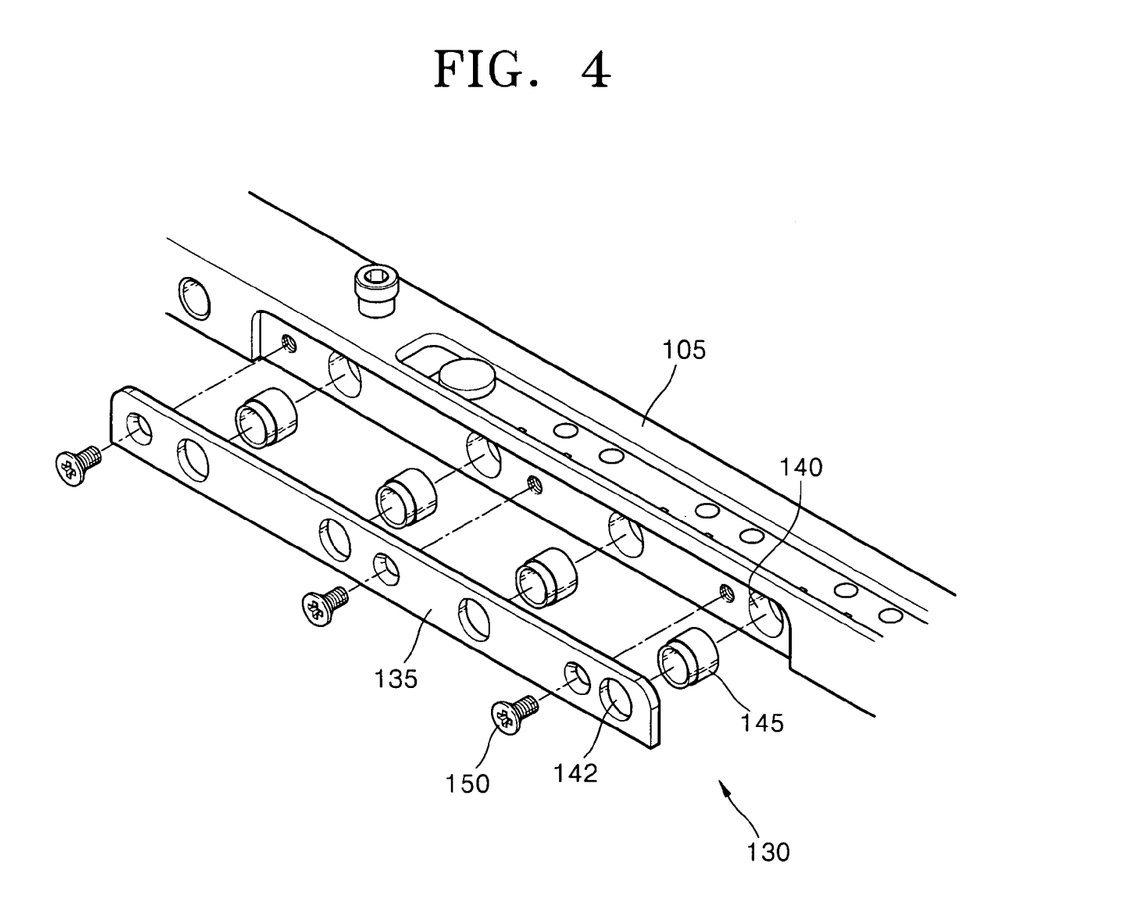
FIG. 4 is an exploded perspective view of a precise location-determining unit of the test tray of FIG. 3.
Figure 5:
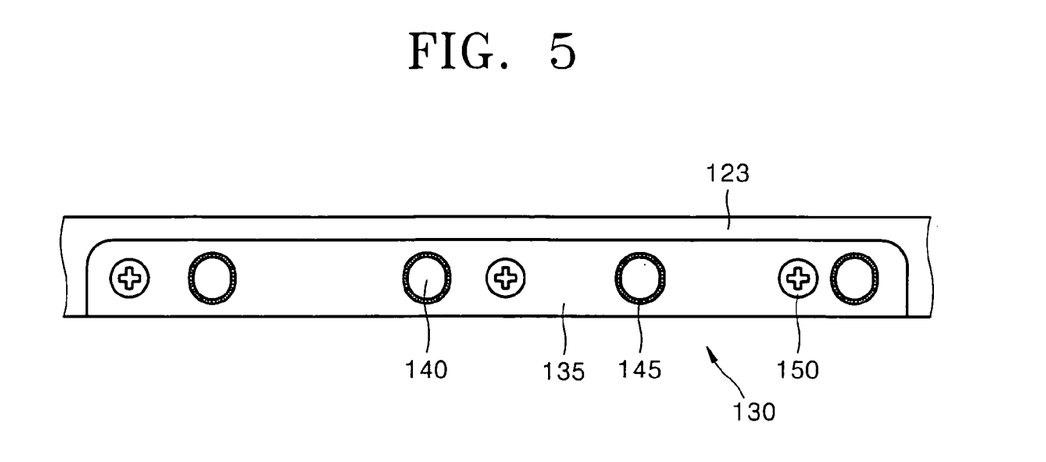
FIG. 5 is an enlarged view of a precise location-determining unit of the test tray of FIG. 3.
Figure 6:
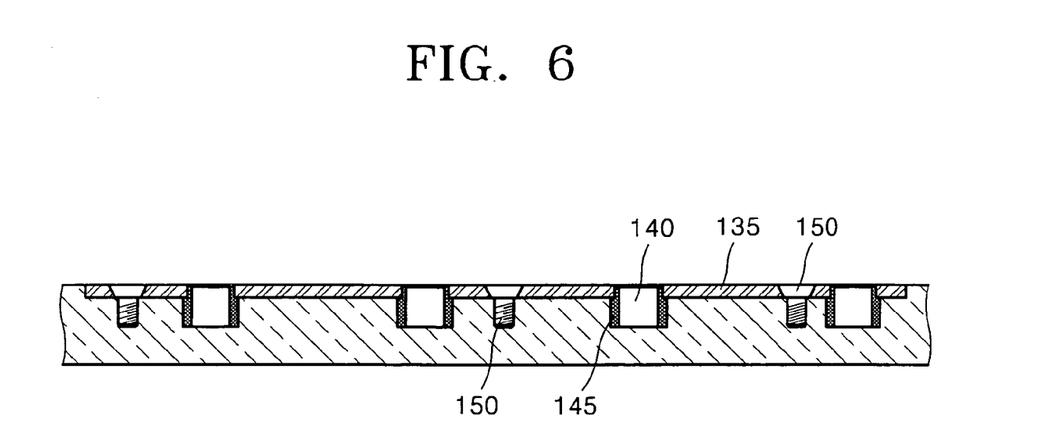
FIG. 6 is a cross-sectional view of the precise location determining unit of FIG. 5.

FIG. 3 is a perspective view illustrating a test tray according to an embodiment of the present invention, and FIG. 4 is an exploded perspective view of a precise location-determining unit of the test tray of FIG. 3. FIG. 5 is an enlarged view of a precise location-determining unit of the test tray of FIG. 3, and FIG. 6 is a cross-sectional view of the precise location determining unit of FIG. 5.

Referring to FIG. 3, a test tray 100 according to an embodiment of the present invention comprises a rectangular shaped frame 105, horizontal bars 120 formed to cross both sides of the frame 105 to define a plurality of regions, a plurality of transport modules 110 along the horizontal bar 120, and a tray recognition unit 125 mounted on a surface of the frame 105. Reference numeral 115 in the transport modules 110 indicates a semiconductor device-inserting unit on which semiconductor devices 11 (not shown in FIG. 3) are loaded.

The precise location determining units 130, that precisely determine the location and fix the test tray 100, is mounted on both side portions 23 (see FIG. 2) of the test tray 100. The precise location-determining units 130, as depicted in FIG. 2, are located relative to, e.g., along, a direction parallel to the moving direction of the test tray 100 within a handler system.

The precise location-determining unit 130 is composed of a locking hole 140 in the frame 105, a bushing 145 that is inserted in the locking hole 140 to prevent wearing of the locking hole 140, a protection bar 135 that covers the frame 105 and the bushing 145, and a connection hole 142 (FIG. 4) and a bolt 150 that couples the protection bar 135 and the frame 105, e.g., attaches the protection bar 135 to the frame 105. The protection bar 135 is coupled to the frame 105 by being inserted into a concave area on each side of the frame 105.

The bushing 145 is formed, for example, of a polymer containing carbon fiber. Thus, the compressive strength and stiffness of the bushing 145 can be increased and the expansion coefficient of the bushing 145 can be reduced. Also, the bushing 145 can have high wearing resistance, high load carrying capability, and high thermal conductivity.

Also, as described above, the location of the test tray 100 is precisely determined and fixed since a positioner 15 (see FIG. 2) is inserted into the locking hole 140 of the precise location-determining unit 130. In this manner, precise location-determining unit 130 and positioner 15 act as first and second locking formations each positionable relative to the other and mutually engagable to fix a selected position of the frame along the movement direction of the test tray 100. Furthermore, the test tray 100 can be continuously used since the bushing 145 prevents the locking hole 140 from wear.

Figure 7:
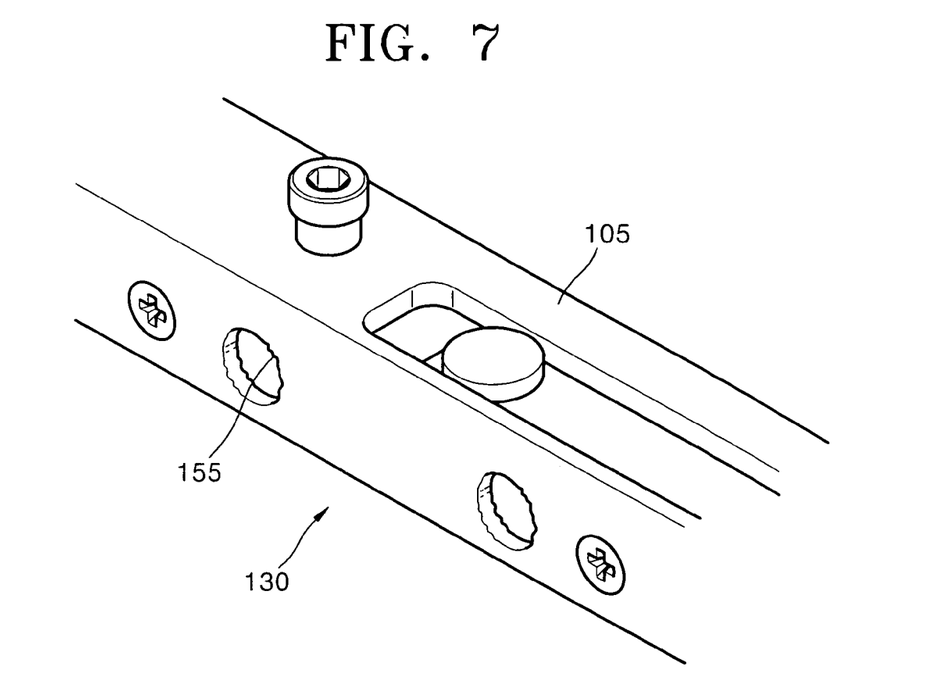
FIGS. 7 and 8 are perspective views respectively illustrating a wearing state of a locking hole without and with, respectively, a bushing in the locking hole.
Figure 8:
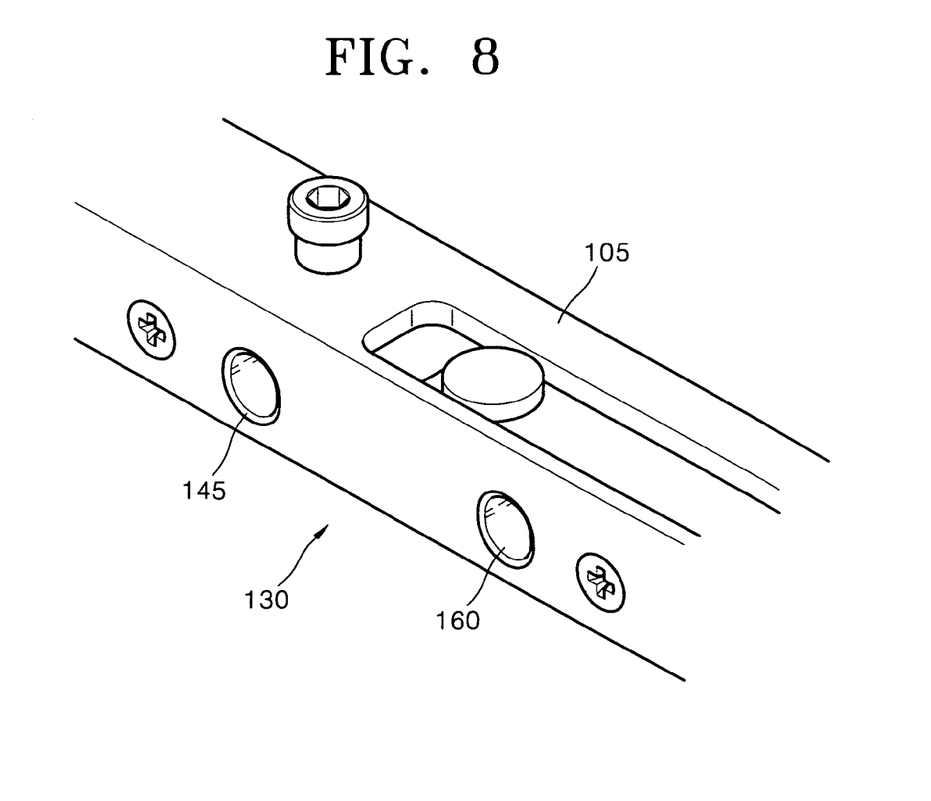

FIGS. 7 and 8 are perspective views respectively illustrating an undesirable wearing state of the locking hole 140 without a bushing 145 (FIG. 7) and an improved state of reduced or no wear when the bushing 145 is mounted in the locking hole 140 (FIG. 8).

Referring to FIGS. 7 and 8, when the bushing 145 is mounted in the locking hole 140 of the precise location determining unit 130 of the test tray 100 according to embodiments of the present invention, as indicated by the reference numeral 160 in FIG. 8, the wearing of the locking hole 140 does not occur. However, as indicated by the reference numeral 155 in FIG. 7, when no bushing 145 is mounted in the locking hole 140, the locking hole 140 is severely damaged, especially irregularly damaged. Therefore, if the bushing 145 is inserted into the locking hole 140 of the precise location-determining unit 130 of the test tray 100, the test tray 100 can be continuously used, e.g., without intervening repair or replacement, since the wearing of the locking hole 140 is prevented.

As described above, a test tray according to some embodiments of the present invention includes a precise location-determining unit that can precisely determine and fix the test tray on both side units of a frame in a direction parallel to the moving direction of the test tray in a handler. The precise location-determining unit includes a locking hole into which a positioner can be inserted, a bushing that can prevent the locking hole from wearing, a protection bar that covers the frame and the bushing, and a connection hole and a bolt to couple the protection bar to the frame.

Therefore, the test tray according to some embodiments of the present invention can solve conventional problems, such as a reduced yield, malfunction or sudden stopping of the handler, since a position of the test tray can be precisely determined when semiconductor devices are loaded, unloaded, and tested.

Furthermore, the test tray according to some embodiments of the present invention can be continuously used since the locking hole is prevented from wear by inserting a bushing into the locking hole when the locations of the test tray are precisely determined at a test head part, a supply unit, or a discharge unit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A test tray comprising:
a frame defining a plurality of regions;

a plurality of transport modules within the plurality of regions to receive a plurality of semiconductor devices and located within the frame; and a precise location determining unit including a plurality of parts and being directly mounted on opposing sides of the frame and outside the plurality of regions to precisely determine and to fix the test tray position.

2. The test tray of claim 1, wherein the frame comprises a rectangular shaped frame.

3. The test tray of claim 1, wherein the precise location-determining unit comprises a locking formation to receive an engageably compatible positioner device positionable adjacent to a travel path of the frame.

4. The test tray of claim 3, wherein the locking formation comprises at least one hole formation in the frame and adapted to receive therein a protrusion portion of the positioner device.

5. The test tray of claim 1, wherein the frame includes a bar defining a plurality of regions.

6. The test tray of claim 5, wherein the transport modules are mounted along the horizontal bar and relative to the plurality of regions.

7. The test tray of claim 1, wherein the precise location determining unit is located along the opposing sides in a direction parallel to a moving direction of the test tray.

8. The test tray of claim 1, wherein the precise location determining unit includes a locking hole to receive a selectively positional protrusion element, a bushing to reduce wear of the locking hole, a protection bar to cover the frame and the bushing, and a connection hole and a bolt to couple the protection bar to the frame.

9. A test tray comprising:
a frame;
a bar formed to define a plurality of regions within the frame;
a plurality of transport modules to receive a plurality of semiconductor devices along the bar; and
a precise location determining unit including a plurality of parts and being directly mounted on opposing sides of the frame and outside the plurality of regions to precisely determine and fix the test tray position.

10. The test tray of claim 9, wherein the frame comprises a rectangular shaped frame.

11. The test tray of claim 9, wherein the precise location determining unit is located on both side units of the frame in a direction parallel to the moving direction of the test tray in a handler.

12. The test tray of claim 9, wherein the precise location determining unit includes a locking hole to receive a protrusion element, a bushing to reduce locking hole wear, a protection bar to cover a portion of the frame and the bushing and including a connection hole therethrough. and a bolt to couple the protection bar to the frame.

13. A handler for testing devices, the handler comprising:
a frame defining a plurality of regions to receive a corresponding plurality of semiconductor device transport modules, the frame including at least two first locking formations on opposing sides thereof and outside the plurality of regions;

a transport arranged and structured to move the frame in a movement direction, the at least two first locking formations being positioned along the movement direction;

at least two second locking formations, the at least two first locking formations and the at least two second locking formations being positioned relative to the other and mutually engageable to fix a selected position of the frame along the movement direction.

14. The handler of claim 13, wherein the at least two first locking formations comprise hole formations and the at least two second locking formations comprise protrusion elements insertable into the hole formations.

15. The handler of claim 13, wherein each of the hole formations include a bushing therein.

16. The handler of claim 13, wherein at least one of the at least two first locking formations comprises a precise location determining unit including a locking hole to receive a protrusion element of at least one of the second locking formations, a bushing to reduce locking hole wear, a protection bar to cover a portion of the frame and the bushing and including a connection hole therethrough, and a bolt to couple the protection bar to the frame.

* * * * *